United States Patent
Deval et al.

(10) Patent No.: US 7,538,705 B2
(45) Date of Patent: May 26, 2009

(54) OFFSET CANCELLATION AND REDUCED SOURCE INDUCED 1/F NOISE OF VOLTAGE REFERENCE BY USING BIT STREAM FROM OVER-SAMPLING ANALOG-TO-DIGITAL CONVERTER

(75) Inventors: Philippe Deval, Lutry (CH); Vincent Quiquempoix, Divonne les bains (FR)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 11/779,517

(22) Filed: Jul. 18, 2007

(65) Prior Publication Data
US 2008/0024342 A1    Jan. 31, 2008

Related U.S. Application Data

(60) Provisional application No. 60/820,278, filed on Jul. 25, 2006.

(51) Int. Cl.
    *H03M 3/00*    (2006.01)
(52) U.S. Cl. ............... 341/143; 341/155; 341/120; 341/118; 341/119
(58) Field of Classification Search ............... 341/143, 341/155, 117–120
    See application file for complete search history.

(56) References Cited

U.S. PATENT DOCUMENTS

| | | | | |
|---|---|---|---|---|
| 4,939,516 | A | 7/1990 | Early | 341/143 |
| 5,039,989 | A | 8/1991 | Welland et al. | 341/143 |
| 6,462,612 | B1 | 10/2002 | Roh et al. | 327/539 |
| 6,590,426 | B2 * | 7/2003 | Perrott | 327/7 |
| 6,639,532 | B1 | 10/2003 | Liu et al. | 341/143 |
| 6,788,131 | B1 | 9/2004 | Huang | 327/539 |
| 6,864,814 | B1 | 3/2005 | Fike | 341/120 |
| 6,909,388 | B1 | 6/2005 | Quiquempoix et al. | 341/143 |
| 6,952,176 | B2 | 10/2005 | Frith et al. | 341/143 |
| 6,961,385 | B2 | 11/2005 | Plisch et al. | 375/259 |
| 7,102,558 | B2 | 9/2006 | Deval | 341/150 |
| 7,170,338 | B1 | 1/2007 | Tucker | 330/9 |
| 2005/0122245 | A1* | 6/2005 | Frith et al. | 341/150 |
| 2005/0190092 | A1* | 9/2005 | Gulati et al. | 341/155 |

FOREIGN PATENT DOCUMENTS

WO    PCT/US05/117269    5/2005

OTHER PUBLICATIONS

International Search Report and Written Opinion for PCT/US2007/074197 mailed Dec. 17, 2007.

(Continued)

*Primary Examiner*—Jean B Jeanglaude
(74) *Attorney, Agent, or Firm*—King & Spalding LLP

(57) ABSTRACT

An over-sampling analog-to-digital converter (ADC) uses a chopper stabilized voltage reference with improved reference voltage offset cancellation and reduced source induced 1/f noise. The chopper stabilized voltage reference receives chopper clocks that have been correlated with the serial bitstream produced by the sigma-delta modulator of the ADC. The chopper clocks are generated so that the reference voltage produces for each distinct bitstream level an independent sequence of voltages that comprise alternatively positive and negative voltage reference offset contributions. After integration (averaging) is performed within the sigma-delta modulator, these equal and opposite reference offset contributions cancel out regardless of the bit pattern comprising the bitstream.

13 Claims, 9 Drawing Sheets

OTHER PUBLICATIONS

16-Bit Analog-to-Digital Converter with Onboard Reference—ADS1110; Mar. 2003—Revised Nov. 2003; Burr-Brown Products from Texas Instruments; pp. 1-19.

A 90-dB SNR 2.5-MHz Output-Rate ADC Using Cascaded Multibit Delta-Sigma Modulation at 8+Oversampling Ratio, Ichiro Fujiimori, Member, IEEE, Lorenzo Longo, Armond Hairapetian, Kazushi Seiyama, Steve Kosic, Jun Cao, Member, IEEE, and Shu-Lap Chan; IEEE Journal of Solid-State Circuits, vol. 35, No. 12, Dec. 2000; pp. 1820-1828.

Getting the Most Out of Delta-Sigma Converters; Russell Anderson, Texas Instruments Incorporated; pp. 1-7, no date.

* cited by examiner

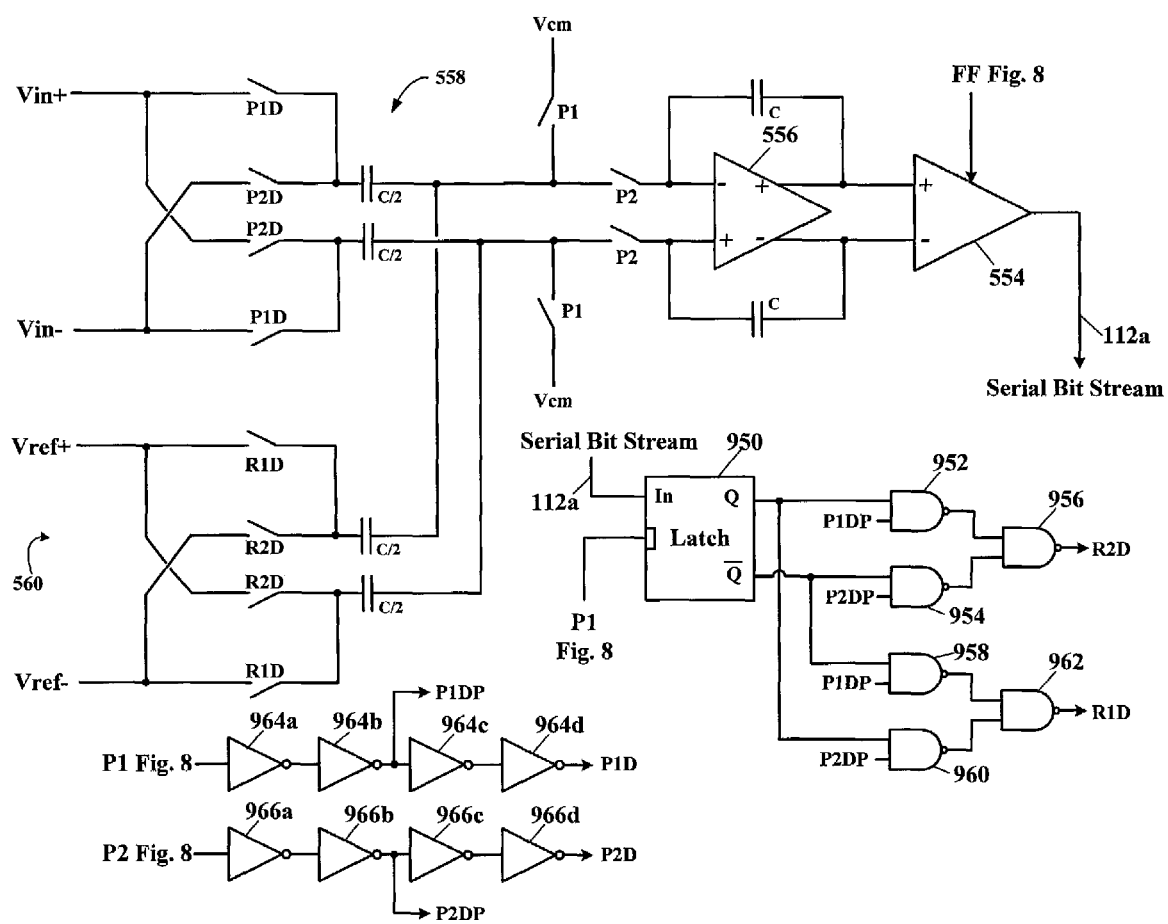

__US 7,538,705 B2__

OFFSET CANCELLATION AND REDUCED SOURCE INDUCED 1/F NOISE OF VOLTAGE REFERENCE BY USING BIT STREAM FROM OVER-SAMPLING ANALOG-TO-DIGITAL CONVERTER

RELATED PATENT APPLICATION

This application claims priority to commonly owned U.S. Provisional Patent Application Ser. No. 60/820,278; filed Jul. 25, 2006; entitled "Bitstream Dependent Switching Algorithm for Reference Voltage Offset Cancellation and Reduced Reference Voltage Source Induced 1/f Noise in Oversampling Data Converters," by Philippe Deval and Vincent Quiquempoix; which is hereby incorporated by reference herein for all purposes.

TECHNICAL FIELD

The present disclosure relates to analog-to-digital converters (ADCs) and, more particularly, to a way of reducing 1/f noise and direct current (DC) offset from a voltage reference source associated with the analog-to-digital converter.

BACKGROUND

Analog-to-digital converters (ADCs) are in widespread use today in electronic applications for consumer, medical, industrial, etc. Typically, ADCs include circuitry for receiving an analog input signal and outputting a digital value proportional to the analog input signal. This digital output value is typically in the form of either a parallel word or a serial digital bit string. There are many types of analog-to-digital conversion schemes such as voltage-to-frequency conversion, charge redistribution, delta modulation, as well as others. Typically, each of these conversion schemes has its advantages and disadvantages.

One type of analog-to-digital converter (ADC) that has seen increasing use is the switched capacitor sigma-delta ADC (sigma-delta and delta-sigma will be used interchangeably herein). The sigma-delta ADC utilizes delta-sigma modulation where an analog voltage is input to the delta-sigma modulator and the output thereof is filtered to remove noise. A delta-sigma modulator typically converts an analog input to a digital serial string of "ones" and "zeros" having an average amplitude over time proportional to the analog input. Delta-sigma modulation generally provides for high accuracy and wide dynamic range as compared to earlier delta modulation techniques. Delta-sigma modulation is often referred to as an oversampled converter architecture and is typically immune from some of the earlier undesirable second order effects of delta modulation.

The switched capacitor sigma-delta converter uses a digital-to-analog converter (DAC) in a feedback loop that applies a voltage(s) to an analog summing node located at the front end (analog portion) of the delta-sigma modulator. This DAC feedback loop voltage may be derived from a voltage reference (voltage reference and reference voltage will be used interchangeably herein) where Vref is the voltage difference between nodes 114$a$ and 114$b$, (FIG. 2) e.g., Vref=(Vref+−Vref−). In the following sections we assume, +Vref=(Vref+−Vref−) and −Vref=(Vref−−Vref+). However, with any ADC there are a number of noise sources that are inherent in the ADC design. In a typical delta-sigma ADC, there are typically three types of noise: the quantization noise coming from the error introduced by the quantizer in the feedback loop, the thermal noise coming from the devices of the converter itself and the 1/f noise coming also from the devices. In addition, since the output code of the ADC is proportional to the ratio of the input voltage and the reference voltage, any additional noise coming from the reference voltage will be present at the output especially when the ratio of the input voltage over reference voltage is close to 1. Moreover, a deterministic error in the voltage reference coming from a DC offset will impact the ADC as a gain error.

The quantization noise at low frequencies is relatively low with the largest portion thereof existing at higher frequencies. This higher frequency portion noise can be filtered out by a digital domain filter, e.g., decimation and/or digital low-pass filter. Moreover, the quantization noise can be lowered by increasing either the order of the modulator or the resolution of the DAC. The thermal noise coming from both the reference voltage and the ADC can be averaged by increasing the oversampling ratio of the converter. However, averaging techniques do not filter DC offset and 1/f noise, especially when they come from the voltage reference, as they are typically passed through the converter with the signal information. For high-resolution ADCs, 1/f noise becomes the dominant one when both quantization and thermal noise have been reduced. It is very difficult to attenuate since it is not affected by increasing complexity of the ADC (higher order, multi-bit DAC) or the oversampling.

DC offset from the voltage reference may be substantially reduced by using a chopper stabilized voltage reference. A typical chopper stabilized bandgap voltage reference is more fully described in U.S. Pat. No. 6,462,612, entitled "Chopper Stabilized Bandgap Reference Circuit to Cancel Offset Variation" by Roh et al., and is incorporated by reference herein for all purposes. The chopper stabilized voltage reference substantially reduces direct current (DC) offset voltage error in the voltage reference. However, the typical chopper stabilized voltage reference requires an analog low-pass filter at the output of the reference to remove the components of the high-frequency modulation introduced by the chopper stabilization.

SUMMARY

Therefore there is a need to overcome the above-identified problems as well as other shortcomings and deficiencies of existing technologies by providing improved reference voltage offset cancellation and reduced voltage reference induced 1/f noise in oversampled analog-to-digital converters.

According to the teachings of this disclosure, the DC offset and 1/f (pink) noise of a voltage reference, e.g., band gap voltage reference, rapidly becomes a limitation for high resolution analog-to-digital converters (ADCs). Chopping the voltage reference amplifier significantly reduces the aforementioned undesired noise and offset from the voltage reference. Chopping the voltage reference amplifier is easier in a switched-capacitor (SC) converter than in a continuous time because constraints are reduced and no output filter is required if the chopper frequency is synchronous with the sampling frequency. The only requirement is to have a fast enough amplifier that is able to settle in one clock period. But in most of the situations, this requirement is mandatory, even without chopping in order to ensure high accuracy of the sampled signal. Also chopping the voltage reference amplifier only requires a few additional switches in most applications.

However, some additional care is required when the voltage reference that is chopped is used in an oversampling converter. What is very important is the way the voltage reference amplifier is chopped: It must be ensured that each time one offset component is added it must be removed (or compensated for) by taking the opposite chopper configuration as soon as the same DAC configuration is seen.

This can be easily ensured during a double transfer of Vref: precharging to Vref+ and transfer to Vref− results in a total transfer of 2 Vref with no more offset component. Here the output of the voltage reference amplifier is connected in the "positive" configuration during precharge and the "negative" configuration during transfer. So at the end of the double Vref transfer the charge that has been processed does not contain any offset and the 1/f noise is attenuated because the Vref has been processed with both positive and negative configurations.

However even though 2 or 3-level DACs may exclusively use double transfers and/or zero (no) transfers to process the 2 or 3-level information (with either +2 Vref, 0 or −2 Vref transferred), most of these existing DACs are using single Vref and/or zero transfers information (with either +Vref, 0 or −Vref transferred). A multi-bit DAC will also typically have to use single Vref transfers depending on what is the input code value. During these single Vref transfers, the offset component cannot be cancelled with the standard chopper algorithm: for example if the DAC has to transfer one Vref, after precharging at Vref with the voltage reference amplifier connected in the "positive" configuration and transfer zero with the voltage reference amplifier connected in the "negative" configuration (due to the chopping that changes the configuration at each clock). Since this value of the reference voltage processed is zero for the second phase, the "negative" configuration of the voltage reference does not impact the result of the transfer and the total value transferred is then Vref plus the offset component.

For each single Vref processing the voltage reference amplifier will be in the same configuration as the one described above and the standard chopping is inefficient here as the value of the voltage reference transferred will include the offset component. So the way the voltage reference amplifier is chopped must take in account, or remember, the configuration it used during the previous transfer of Vref and use the complimentary one (e.g., precharge in "negative" configuration and transfer in "positive" configuration) during the present single Vref transfer in order to add the opposite of the offset component which would cancel the total offset component after two, or any even number of single Vref transfers.

Such technique may also be used for the double Vref transfer. This adds the advantage of doing a double transfer with the same configuration of the voltage reference amplifier during precharge and transfer phases and thus prevents a jump on the common mode during the double Vref transfer. It may also simplify the state machine logic that drives the chopper control signals.

For each DAC output configuration, i.e., for each DAC input code, the idea is to modulate the chopping algorithm so that whenever an offset component is transferred by the DAC to the sigma-delta modulator, this offset component will be cancelled by an opposite offset component that would be obtained using the complimentary chopper configuration.

For single-order modulators where the order of the integration is 1 as in the current specific example embodiments of this disclosure, each DAC configuration will show a complimentary chopper configuration compared to the previous one memorized for this DAC configuration. This technique will result after two samples having the same DAC input in transferring the offset component in both positive and negative ways so that the first order integrator will sum these equal and opposite contributions to cancel out any offset voltage. If one extracts the chopper sequencing related to each individual DAC input every time this input is given by the modulator, this sequence would be the standard chopping sequence: +, − that would cancel the offset after each even number of samples.

Preferably, when the voltage reference chopping technique, according to the teachings of this disclosure, is applied to a multiple order sigma-delta converter, it should also follow the fractal algorithm developed for offset compensation and described in U.S. Pat. No. 6,909,388 B1 entitled "Fractal Sequencing Schemes For Offset Cancellation in Sampled-Data Acquisition Systems" by Quiquempoix et al. which is incorporated by reference herein for all purposes.

Basically, for each DAC configuration, the sequence of chopping configurations will have to conform to the fractal algorithm, e.g., for a modulator comprising a first order integrator (a "first order modulator") the chopper sequence will be +−+− for canceling offset contributions after the first order integration, for a modulator comprising a second order integrator (a "second order modulator") the chopper sequence will be +−−+ (instead of +−+− used for the first order integrator) for canceling offset contributions after the second order integration, and for a modulator comprising a third order integrator (a "third order modulator") the chopper sequence will be +−−+−++− for canceling offset contributions after the third order integration, etc. Thus, for an $m^{th}$ order modulator the fractal bit sequences will be $2^m$ bits.

The reason for having to use the fractal algorithm is that after a +/− chopper sequence the offset (Voff) is compensated at the $1^{st}$ integrator output. But during this time the $2^{nd}$ integrator has integrated +Voff. In order to reach zero offset at the $2^{nd}$ integrator we need to compensate this residual +Voff by integrating −Voff in the $2^{nd}$ integrator. This is achieved by the −/+ chopping sequence. The limiting factor is that the offset contribution is perfectly cancelled only after each multiple of $2^m$ samples in the same configuration of the DAC, m being the order of the modulator, which may become very burdensome for modulators having higher order integration, e.g., m>3.

According to a specific example embodiment of this disclosure, an over-sampling analog-to-digital converter (ADC) having improved voltage reference offset cancellation and reduced source induced 1/f noise may comprise: a sigma-delta modulator having an analog input, a reference input and an output supplying serial digital information therefrom; a chopper stabilized voltage reference supplying reference voltages to the reference input of the sigma-delta modulator; a chopper clock control coupled to the chopper stabilized voltage reference and the output of the sigma-delta modulator, wherein the chopper clock control uses the serial digital information from the output of the sigma-delta modulator to generate chopper clocks that cause the chopper stabilized voltage reference to produce a substantially equal number of reference voltages having positive voltage offsets and negative voltage offsets per level of digital-to-analog conversions used in the sigma-delta modulator, whereby an average of the positive and negative voltage offsets substantially cancel out any voltage offset contribution to the reference voltages supplied to the sigma-delta modulator; and a digital filter coupled to the output of the sigma-delta modulator, and adapted to convert the serial digital information into digital words representative of samples of analog voltages on the analog input of the sigma-delta modulator.

BRIEF DESCRIPTION OF THE DRAWINGS

A more complete understanding of the present disclosure thereof may be acquired by referring to the following description taken in conjunction with the accompanying drawings wherein:

FIG. 9 illustrates a schematic logic diagram for a two level, first order sigma-delta modulator shown in FIG. 5 and glue logic for deriving control signals, according to the specific example embodiments of this disclosure.

Figure 1:
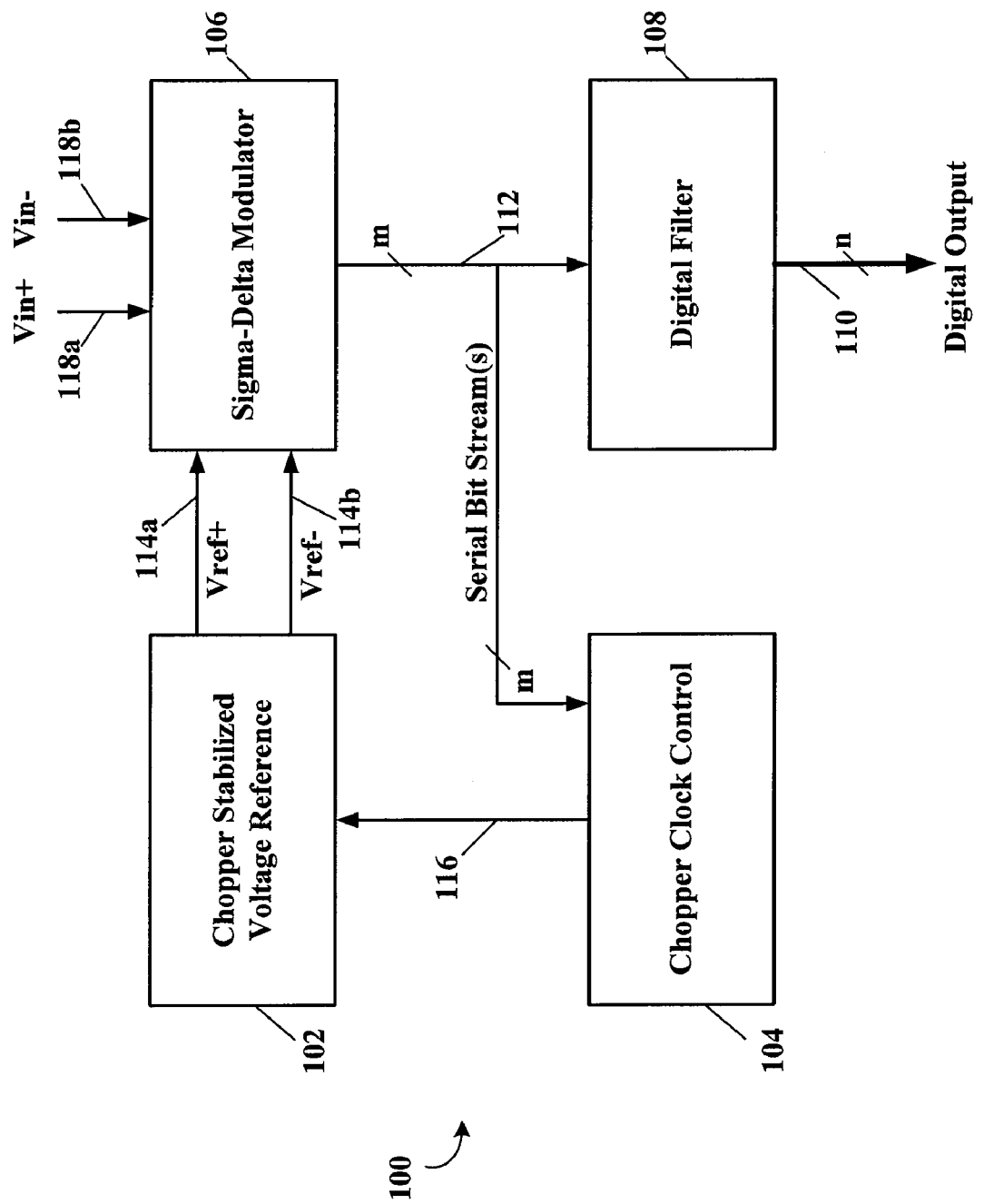
FIG. 1 illustrates a schematic block diagram of a sigma-delta analog-to-digital converter (ADC) having a chopper stabilized voltage reference controlled by a serial bit stream from the sigma-delta modulator, according to specific example embodiments of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawing, the details of specific example embodiments are schematically illustrated. Like elements in the drawings will be represented by like numbers, and similar elements will be represented by like numbers with a different lower case letter suffix.

Referring to FIG. 1, depicted is a schematic block diagram of a sigma-delta analog-to-digital converter (ADC) having a chopper stabilized voltage reference controlled by a serial bit stream from the sigma-delta modulator, according to a specific example embodiment of this disclosure. The sigma-delta analog-to-digital converter, generally represented by the numerical 100, may comprise a sigma-delta modulator 106, a digital decimation and/or low pass digital filter 108, a chopper stabilized voltage reference 102, and a chopper clock control 104.

The chopper stabilized voltage reference 102, e.g., bandgap voltage reference, supplies a reference voltage 114, Vref+ and Vref−, to digital-to-analog converters 560 and 660 (see FIGS. 5 and 6) of the sigma-delta modulator 106. The sigma-delta modulator 106 receives an analog voltage input 118, Vin+ and Vin−, and outputs an oversampled serial bit stream 112 whose average is proportional to the received analog voltage on the input(s) 118. It is contemplated and within the scope of this disclosure that a single ended voltage reference 102 has a single ended positive voltage Vref+(node 114a) wherein Vref− (node 114b) is connected to ground or common, e.g., Vss, and/or a single ended analog voltage on the input 118a with the input 118b connected to ground or common, e.g., Vss, may also be utilized. This oversampled serial bit stream 112 is also used by the chopper clock control 104 to create appropriately sequenced clock pulses on the chopper clock 116 for the chopper stabilized voltage reference 102, as more fully described herein. It is contemplated and within the scope of this disclosure that a multi-level (m-level, where m>2) digital-to-analog converter (DAC) 660 (FIG. 6) may be used with the sigma-delta modulator 106, as more fully described hereinbelow. First order sigma delta modulators 106a and 106b (modulators having only a first order integrator) are shown and described herein, however, any type of sigma-delta modulator, e.g., ones having higher order integrators (a plurality of cascaded integrators) with or without multiple feedback and/or feed forward loops may be utilized, according to the teachings of this disclosure.

The digital filter 108 receives the oversampled serial bit stream 112 and decimates the digital serial bit stream 112 and/or digitally low pass filters the digital serial bit stream 112 so as to produce an n-bit parallel data word (on bus 110) representative of the analog voltage on the input 118. This decimation and/or low pass filter process also removes most of the high frequency noise because the chopper moves the offset and 1/f noise of the amplifier to an AC component that may be filtered out by the digital filter 108, e.g., low-pass filter. The 1/f noise is a low frequency noise such that the 1/f noise does not change significantly between positive and negative samples of the chopper. Therefore it may be considered as an additional offset that may be filtered out by the digital filter 108 as well. However in practice, the 1/f noise varies slightly between two samples of the chopper. Thus the two AC samples of the 1/f noise will not perfectly cancel. Consequently a small fraction of the initial 1/f noise remains after filtering by the digital filter 108, e.g., low-pass filter.

Figure 2:
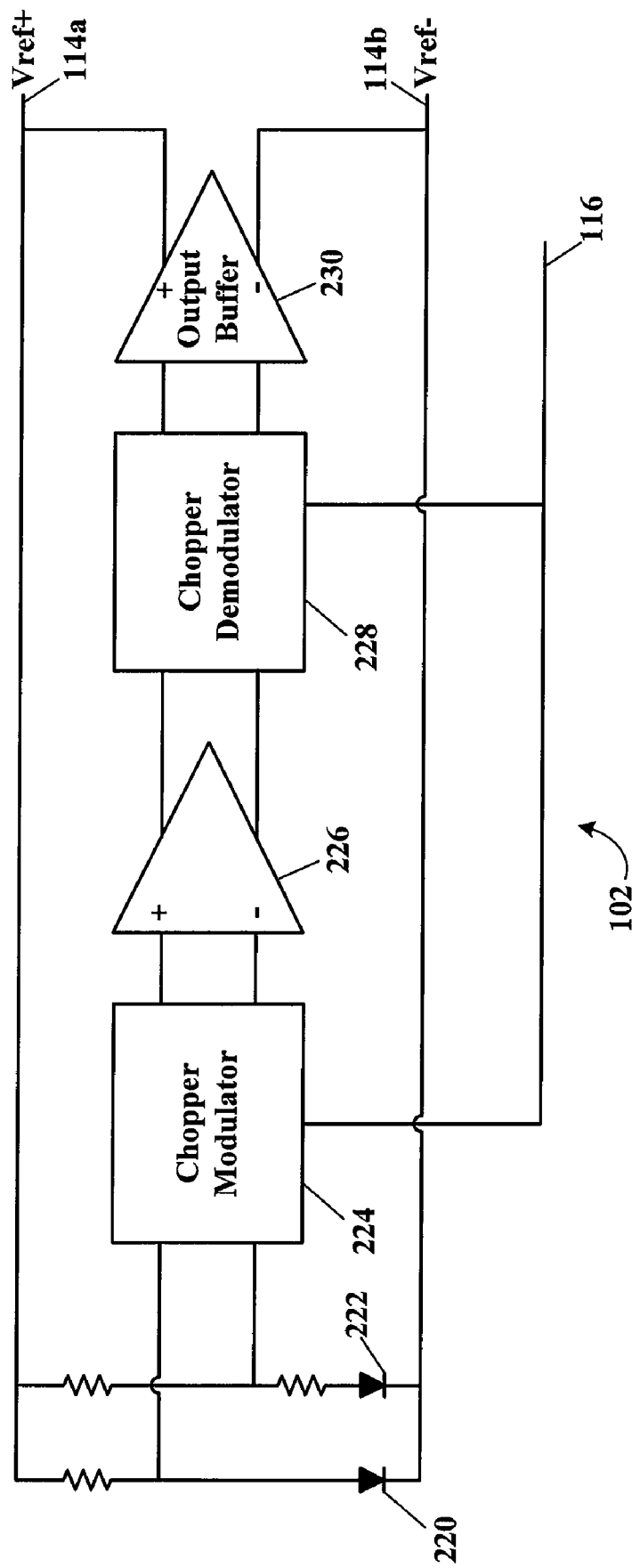
FIG. 2 illustrates a schematic diagram of a typical chopper stabilized voltage reference comprising a bandgap reference as used in the sigma-delta ADC shown in FIG. 1.

Referring to FIG. 2, depicted is a schematic diagram of a typical chopper stabilized voltage reference comprising a bandgap reference as used in the sigma-delta ADC shown in FIG. 1. Bandgap diodes 220 and 222 are coupled to inputs of an amplifier 226 through a chopper modulator 224, and the output of the amplifier 226 is demodulated in the chopper demodulator 228. An output buffer 230 may be used for enhanced drive capabilities and/or as a differential input and singled ended output buffer amplifier. It is contemplated and within the scope of this disclosure that Vref+ (node 114a) may be a positive voltage from a single ended output of the output buffer 230, and that Vref− (node 114b) may be connected to ground or common, e.g., Vss. Clocks from the chopper clock 116 are used to control the chopper modulator 224 and chopper demodulator 228 as more fully described herein. The reference voltage 114, Vref, will take on two values depending on the chop signal on the chopper clock 116 as follows: Vref=Vref+Voff (voltage offset) if the chop signal is at a logic "1" and Vref=Vref−Voff if the chop signal is at a logic "0." So long as an equal number of chop signals at logic "1" and logic "0" are performed, the voltage offset component is canceled out, i.e., the +Voff and −Voff will cancel out, as more fully described hereinbelow. By using the chopper stabilized bandgap voltage reference 102, the reference voltage 114 has an AC component whose amplitude is proportional to the offset of the amplifier modulator 226. However its average value has substantially no offset voltage and 1/f noise. Practically, the above mentioned AC component on the reference voltage 114 is filtered out by the digital filter 108. A typical chopper stabilized voltage reference using a bandgap reference is more fully described in U.S. Pat. No. 6,462,612, entitled "Chopper Stabilized Bandgap Reference Circuit to Cancel Offset Variation" by Roh et al., and is incorporated by reference herein for all purposes.

Figure 3:
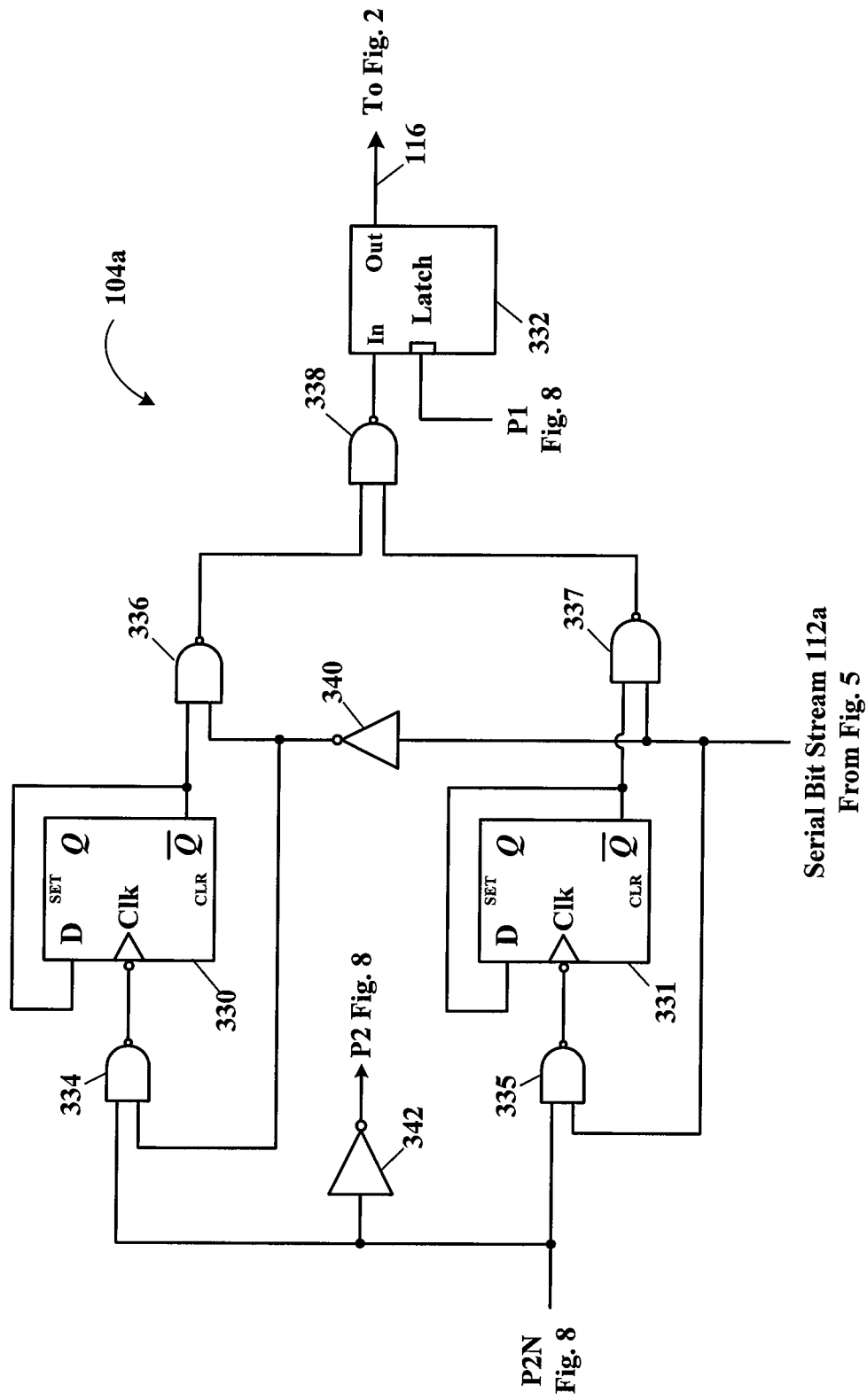
FIG. 3 illustrates a schematic circuit diagram of a clock control circuit for the chopper stabilized voltage reference of FIGS. 1 and 2 when used with a two-level digital-to-analog converter (DAC) of the sigma-delta modulator as shown in FIG. 5, according to a specific example embodiment of this disclosure.
Figure 5:
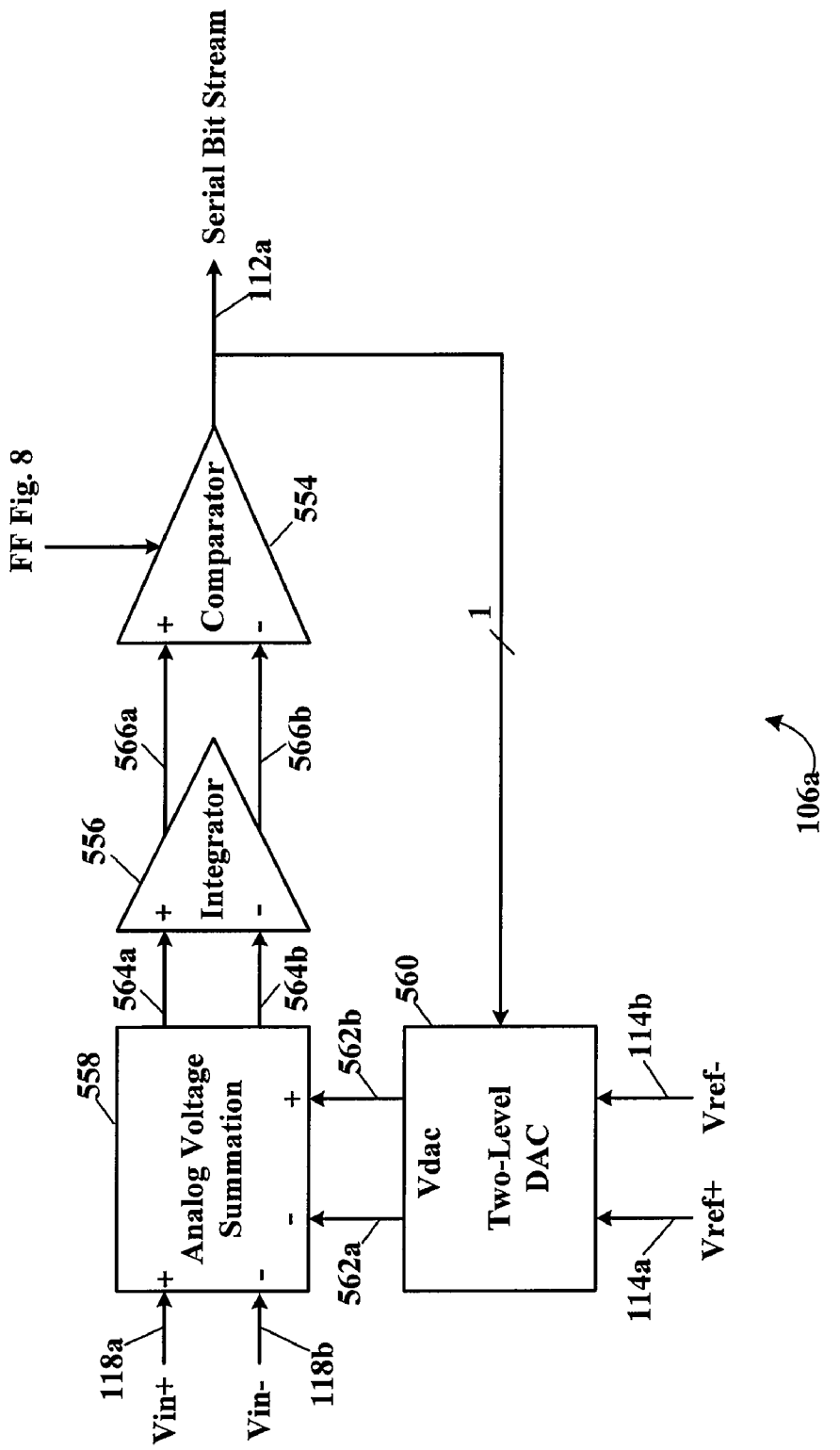
FIG. 5 illustrates a more detailed schematic block diagram of a two level sigma-delta modulator having first order integration and used with the clock control circuit shown in FIG. 3.

Referring to FIG. 5, depicted is a more detailed schematic block diagram of a two-level sigma-delta modulator as used with the clock control circuit shown in FIG. 3. The two-level sigma-delta modulator 106a may comprise a two-level digital-to-analog converter (DAC) 560, a differential analog voltage summation circuit 558, an integrator 556, an analog voltage comparator 554 having a gated output. Let Vdac be the differential voltage (voltage at output 562a-voltage at output 562b). For the specific example embodiment shown of a two-level DAC 560, a single bit control 112a may be used in determining the output transfer functions for this two-level DAC 560 as follows: a binary input 112a of "0" corresponds to a DAC output 562 of Vdac=−Vref, and a binary input 112a of "1" corresponds to a DAC output 562 of Vdac=+Vref. The analog voltage summation circuit 558 will then subtract the DAC output 562 from the voltage on the input 118 in order to provide the input signal 564 of the integrator 556.

The resultant summed voltage (input voltage 118-DAC voltage 562) is coupled to the integrator 556. The integrator 556 will integrate this summed voltage and supply the integrated summed voltage to inputs of the comparator 554. If the resulting integrated voltage (voltage at 566a-voltage at 566b) is positive, then the output 112 of the comparator 554 will be a logic "1." If the resulting integrated voltage (voltage at 566a-voltage at 566b) is negative, then the output 112 of the comparator 554 will be a logic "0." The signal and reference voltages are integrated in the same integrator. Therefore the reference voltage is integrated in such a way that it balances the integrated input voltage. So when the integrator output voltage is positive, Vref is subtracted therefrom.

Figure 8:
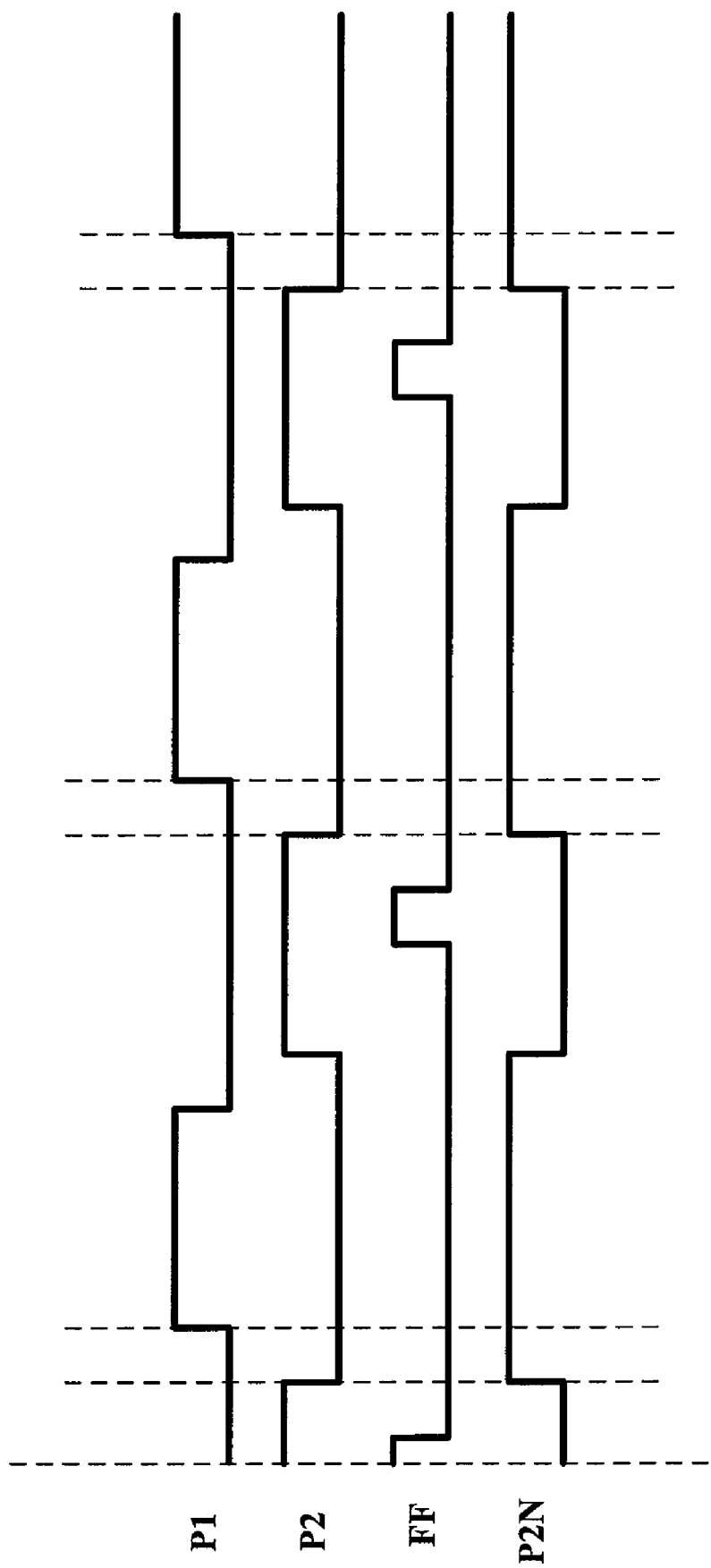
FIG. 8 illustrates a schematic timing diagram of control signals used in the specific example embodiments of this disclosure.

The most current logic level of the output of the comparator 554 is gated (stored) in the comparator 554 on each FF clock (FIG. 8). The output from the comparator 554 becomes the serial bit stream 112a that is used to control the DAC 560, and is also sent to the decimation and/or low pass filtering of the digital filter 108 (FIG. 1).

In the sigma-delta modulator 106a shown in FIG. 5, the reference voltage 114 is added to the incoming voltage, Vin, in a positive way when the current value of the serial bit stream 112a is at a logic 0 and in a negative way when the bitstream is at a logic 1. The reference voltage 114, Vref, from the chopper stabilized voltage reference 102 is directly applied to the sigma-delta modulator 106a through the DAC 560 (the voltage offset component, Voff, is not filtered out).

Assume for example, logic levels 1, 0, 1, 0, 1, 0, 1, 0 for the serial bit stream 112a and a voltage reference that is not chopped. Lets now assume that the bandgap amplifier 226 induces an offset voltage, Voff, onto the reference voltage 114 (Vref becomes Vref+Voff). If the reference voltage 114 is integrated with the current serial bit stream, the Vref component at the output of the integrator 556 will be: −(Vref+Voff)+(Vref+Voff)−(Vref+Voff)+(Vref+Voff)−(Vref+Voff)+(Vref+Voff)−(Vref+Voff)+(Vref+Voff) . . . =0 (after any even number of samples). Here the offset component is cancelled because the number of zeros and ones in the bitstream are equal. Assume now a standard chopper algorithm (sequence of +− repeated) for the voltage reference 114. The Vref at the input of the DAC will be alternatively Vref+Voff or Vref−Voff. If the chopped reference voltage 114 is integrated with the serial bit stream 112a, the Vref component at the output of the integrator 556 will be: −(Vref+Voff)+(Vref−Voff)−(Vref+Voff)+(Vref−Voff)−(Vref+Voff)+(Vref−Voff) . . . =−n*Voff (after n samples). There is a problem in this case because the integrated voltage should be zero, the offset component should be cancelled by the chopper sequence. Here, the offset component is not cancelled because the chopped offset of the bandgap amplifier 226 is modulated by the bitstream at the integrator output.

Assume now for example, logic levels 0, 1, 0, 1, 0, 1, 0, 1 for the serial bit stream 112a, this would correspond to the same input voltage level as before since the bitstream average is the same. With a voltage reference that is not chopped, the Vref component at the output of the integrator 556 will be: +(Vref+Voff)−(Vref+Voff)+(Vref+Voff)−(Vref+Voff)+(Vref+Voff)−(Vref+Voff) . . . =0 (after any even number of samples) which is logical because it corresponds to the same input voltage as before. However if we assume now a standard chopper algorithm (sequence of +−) for the voltage reference 114, the Vref component at the output of the integrator 556 will be: +(Vref+Voff)−(Vref−Voff)+(Vref+Voff)−(Vref−Voff)+(Vref+Voff)−(Vref−Voff) . . . =+n*Voff (after n samples). In this case, the integrated reference component at the output of the integrator is the opposite of the integrated component found before: These two examples show that the integrated reference component at the output of the integrator is bitstream dependent and can lead to very different results even with the same input voltage as soon as the bitstream varies. This problem leads to major non-linearity issues in the transfer function of the ADC and needs to be overcome when using chopped reference voltage sources.

In order to prevent this, the usual technique of low-pass filtering the chopped bandgap voltage before applying it to the DAC may be used: When you low-pass filter the Vref+Voff Vref−Voff Vref+Voff Vref−Voff Vref+Voff Vref−Voff . . . sequence, you get the proper offset cancellation. However this requires extra circuitry (typically an additional integrator reset every two samples) that needs to operate at least twice as fast as the delta-sigma integrator 556, thus consuming additional power. Moreover the low-pass filter must be offset free.

The two examples given herein above show the limitation of the standard chopper algorithm and clearly show the need of modulating the chopper algorithm with the bitstream in order to properly cancel the offset component with any incoming bitstream. The required modulation is done in the chopper clock control 104 shown in FIG. 1. The chopper clock control 104 modulates the chopper signal 116 as a function of the bitstream in order to properly cancel the offset component with any incoming bitstream. The goal here is to have the same amount of positive and negative integrations of the voltage reference offset component for each individual DAC level taken. This goal is achieved by generating a chopping sequence per DAC output level, considering these sequences as independent and switch to the corresponding sequence when one DAC output is taken. Each independent chopping sequence will cancel independently the offset contribution coming from the reference when the corresponding DAC output is taken.

For a two-level DAC, there are two possible DAC output levels: +Vref and −Vref. Thus two independent chopping sequences will be generated; each one will cancel the offset contributions of the voltage reference when the corresponding DAC output is taken. For a modulator having only a first order integrator, each independent sequence can follow the standard chopper sequence (+−) so that the offset contribution is cancelled after integration of two samples with the same DAC output. In this case, when both the number of samples taken with the DAC output equal to +Vref and −Vref are even, the total integrated offset component at the output of the integrator is perfectly cancelled, no matter what the logic level sequences of the bitstream.

Assume for example, logic levels 1, 0, 1, 0, 1, 0, 1, 0 for the serial bit stream 112a and a voltage reference that is chopped with the algorithm disclosed herein. The chopper sequence related to the DAC input 0 is the standard chopper sequence +− as well as the one related to the DAC input 1. So the chopper control signal clock becomes: ++−−++−− (or 1 1 0 0 1 1 0 0 if logic 1 represents an addition of the reference offset component, and—a subtraction of the reference offset component). The Vref component at the output of the integrator 556 will be: +(Vref+Voff)−(Vref+Voff)+(Vref−Voff)−(Vref−Voff)+(Vref+Voff)−(Vref+Voff)+(Vref−Voff)−(Vref−Voff) . . . =0 (after 2n samples) which shows a perfect offset cancellation. The same calculation would also lead to a perfect offset cancellation for the inverted bitstream 0, 1, 0, 1, 0, 1, 0, 1. The chopper control signal generated by the block 104 is in this case 1,1, 0,0,1,1,0,0 which differs from the standard sequence 1, 0, 1, 0, 1, 0, 1, 0. In order to show the two independent sequences for each DAC level may be shown in the following table with DAC output versus chopping control signal:

|  | Sample Number | | | | | | | |
| --- | --- | --- | --- | --- | --- | --- | --- | --- |
|  | 1 | 2 | 3 | 4 | 5 | 6 | 7 | 8 |
| DAC Input (Bit stream) | 1 | 0 | 1 | 0 | 1 | 0 | 1 | 0 |
| Sequence 0 (DAC Input = 0) |  | 1 +Voff |  | 0 −Voff |  | 1 +Voff |  | 0 −Voff |
| Sequence 1 (DAC Input = 1) | 1 +Voff |  | 0 −Voff |  | 1 +Voff |  | 0 −Voff |  |
| Chopper Sequence | 1 +Voff | 1 +Voff | 0 −Voff | 0 −Voff | 1 +Voff | 1 +Voff | 0 −Voff | 0 −Voff |

In case of an $M^{th}$ order modulator (M>1), the correct offset cancellation is obtained for each sequence by following the $M^{th}$ order sequence derived from applying M times to the standard (+−) sequence the fractal algorithm developed for offset compensation as more fully described in U.S. Pat. No. 6,909,388 B1 entitled "Fractal Sequencing Schemes For Offset Cancellation in Sampled-Data Acquisition Systems" by Quiquempoix et al., which is incorporated by reference herein for all purposes. Based on the teachings of this disclosure, the perfect offset cancellation is achieved after the integration of a multiple of $2^M$ samples with the same DAC output.

Correlating and modulating the chopper sequence with the serial bitstream 112a and appropriate algorithm shows, after integration of an even number of samples (or a multiple of $2^M$ samples for an $M^{th}$ order modulator) per DAC level, the exact bandgap voltage, with no more offset component according to the teachings of this disclosure. No low-pass filter is needed between the chopper stabilized voltage reference 102 and the DAC 560. The output 114 of the voltage reference 102, if low-pass filtered, will also show an average equal to the Vref voltage with no more offset component, comparable to a voltage reference with a standard chopper algorithm that would be low-pass filtered.

Referring to FIG. 9, depicted is a schematic logic diagram for a two-level, first order sigma-delta modulator as shown in FIG. 5 and glue logic for deriving control signals, according to a specific example embodiment of this disclosure. Control signals P1D (P1 delayed) and P2D (P2 delayed) are generated by a signal time delay circuit comprising a plurality of gates 964 and 966, respectively. Control signals R1D and R2D are generated with the latch 950 and logic gates 952-962. All other circuits shown in FIG. 9 function as described hereinabove for FIG. 5.

Figure 4:
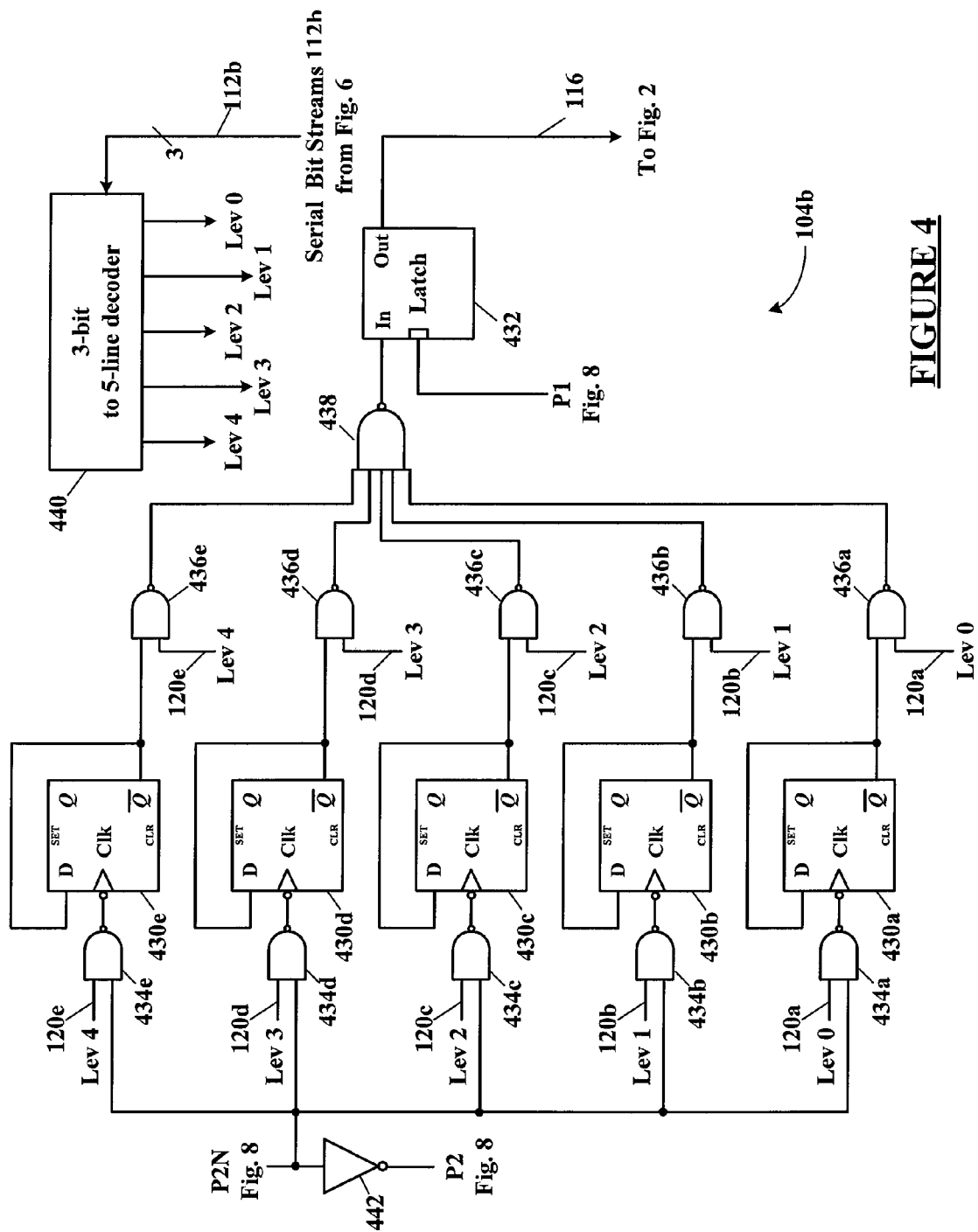
FIG. 4 illustrates a schematic circuit diagram of a clock control circuit for the chopper stabilized bandgap voltage reference of FIGS. 1 and 2 when used with a five-level digital-to-analog converter (DAC) of the sigma-delta modulator shown in FIG. 6, according to another specific example embodiment of this disclosure.
Figure 6:
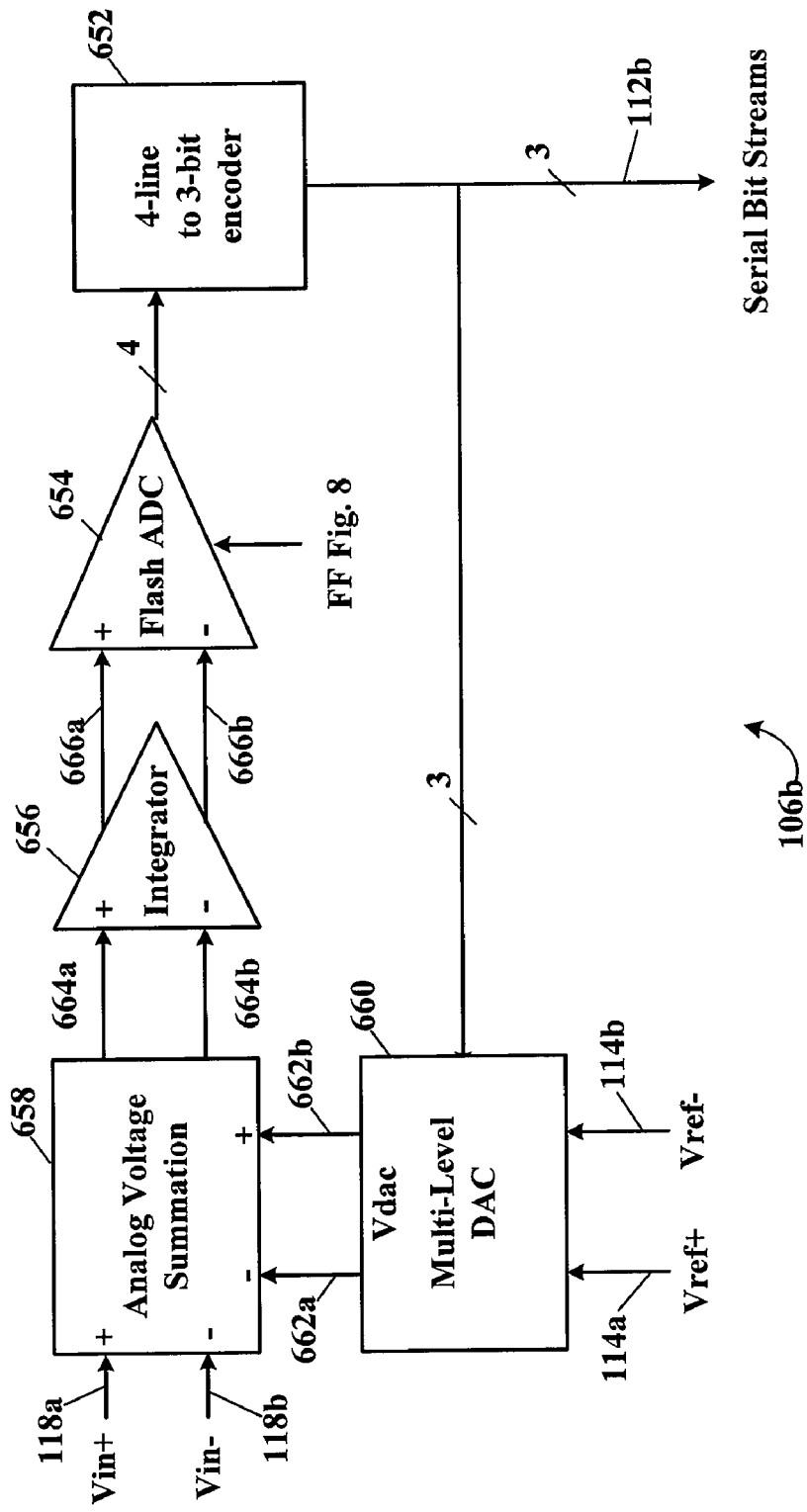
FIG. 6 illustrates a more detailed schematic block diagram of a multi-level sigma-delta modulator having first order integration and used with the clock control circuit shown in FIG. 4.

Referring to FIG. 6, depicted is a more detailed schematic block diagram of a multi-level sigma-delta modulator having first order integration and used with the clock control circuit shown in FIG. 4. The multi-level sigma-delta modulator 106b may comprise a multi-level digital-to-analog converter (DAC) 660, a differential analog voltage summation circuit 658, an integrator 656, a gated flash analog-to-digital converter (ADC) 654 and a 4-line to 3-bit encoder 652. For the specific example embodiment shown of a five-level DAC 660, a three bit control 112b may be used for determining the output 662 transfer functions for this five-level DAC 660 as follows:

| DAC output | Binary control input |
| --- | --- |
| −Vref | $000_b$ |
| −½ Vref | $001_b$ |
| 0 | $010_b$ |
| +½ Vref | $011_b$ |
| +Vref | $100_b$ |

Conversion of analog signals to digital representations thereof by the sigma-delta modulator 106b is well known to those having ordinary skill in the art of analog and digital circuit design.

A multi-level DAC 660, e.g., five-level DAC is more fully described in commonly owned U.S. Pat. No. 7,102,558, entitled "Five-Level Feed-Back Digital-to-Analog Converter for a Switched Capacitor Sigma-Delta Analog-to-Digital Converter" by Philippe Deval, and is incorporated by reference herein for all purposes. The reference voltage values available to the analog voltage summation circuit 658 will be non-inverted, (e.g., positive) and inverted (e.g., negative) values of Vref and fractional values thereof. However, whether the reference offset voltage value Voff applied is positive or negative still depends on the sequence of the chopper clocks 116 being correlated with the serial bitstreams 112b so that the correct reference integrated voltage will be after each even number of integrations (or $2^M$ integrations for a modulator having $M^{th}$-order integration) per DAC output voltage. Thus making the chopper clocks 116 dependant upon the serial bit stream 112b so that an equal number of these clocks, i.e., Vref+Voff (clock 116 at logic 1) and Vref–Voff (clock 116 at logic 0), are performed according to the bit patterns of the serial bitstreams 112b.

Figure 7:
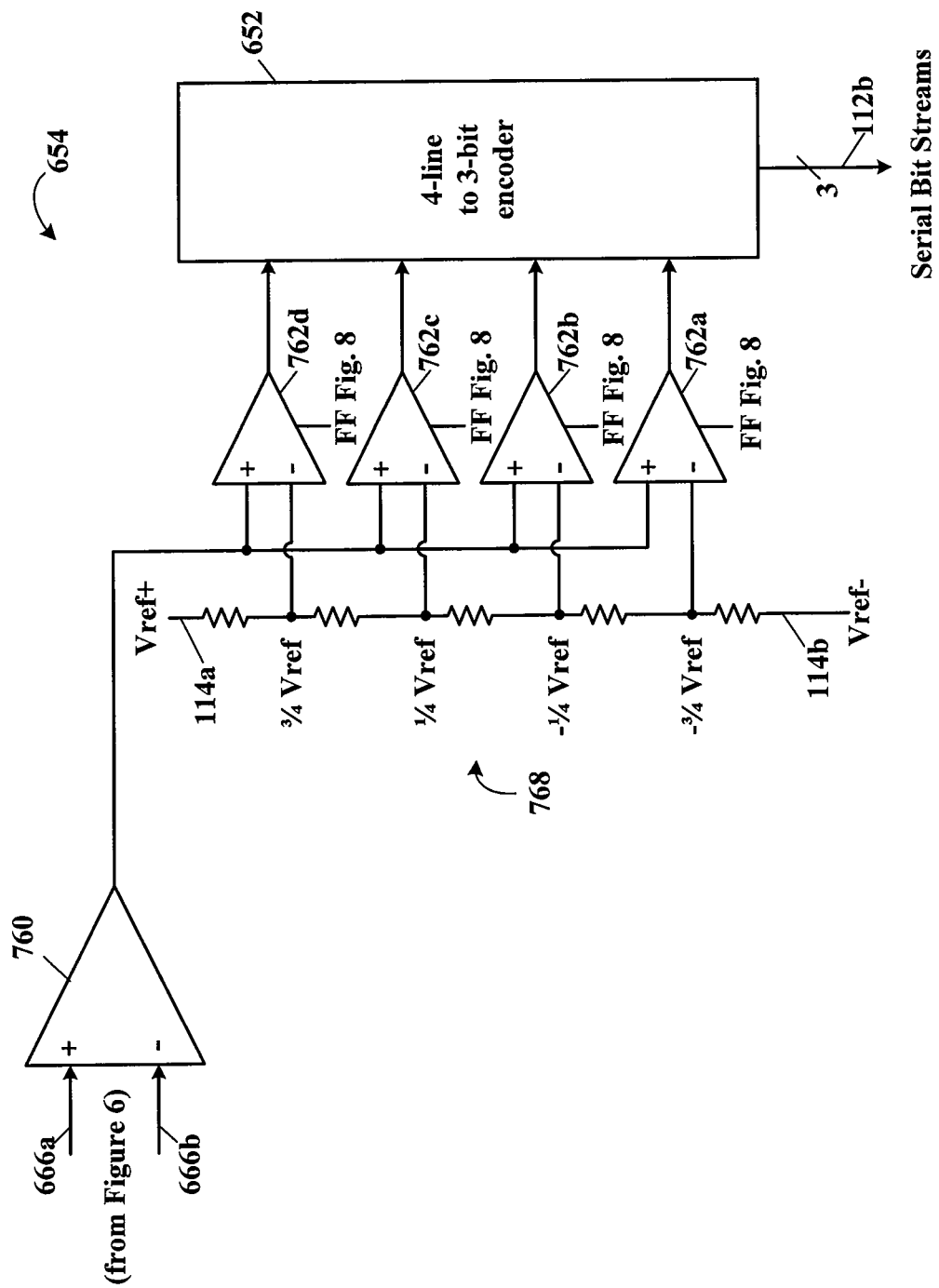
FIG. 7 illustrates a more detailed schematic diagram of a five-level flash analog-to-digital converter (ADC) as used with the multi-level sigma-delta modulator shown in FIG. 6.

Referring to FIG. 7, depicted is a more detailed schematic diagram of a five-level flash analog-to-digital converter (ADC) as used with the multi-level sigma-delta modulator shown in FIG. 6. The flash ADC 654 may comprise a differential buffer amplifier 760 having inputs coupled to the differential outputs 664 and 666 of the integrator 656 (FIG. 6), a plurality of comparators 762, a resistor ladder network 768 used for voltage reference division, and a four-line to three-bit encoder 766. For the specific example embodiment shown, the four comparators 762a, 762b, 762c and 762d have thresholds of –¾ Vref, –¼ Vref, +¼ Vref and +¾ Vref, respectively. Thus, the outputs of the comparators 762 may be for various voltage inputs, Vin, as follows:

| Vin | Output of 762d | Output of 762c | Output of 762b | Output of 762a |
|---|---|---|---|---|
| Vin < –¾ Vref | 0 | 0 | 0 | 0 |
| Vin < –¼ Vref | 0 | 0 | 0 | 1 |
| Vin < +¼ Vref | 0 | 0 | 1 | 1 |
| Vin < +¾ Vref | 0 | 1 | 1 | 1 |
| Vin >= +¾ Vref | 1 | 1 | 1 | 1 |

Thus the output code from the comparators 762 is the sum of the comparator outputs in decimal, e.g., thermometer coding. The comparator outputs may further be encoded into binary coding with the four-line to 3-bit encoder 766. For example, the thermometer coding may be represented in binary coding as follows: Outputs 0000 may be coded as $000_b$, outputs 0001 may be coded as $001_b$, outputs 0011 may be coded as $010_b$, outputs 0111 may be coded as $011_b$, and outputs 1111 may be coded as $100_b$. Thus, the multi-bit signal 664 may be a three-bit binary coded signal going to control the multi-level DAC 660 (FIG. 6) and to the digital filter 108 (FIG. 1).

Referring to FIG. 8, depicted is a schematic timing diagram of control signals used in the specific example embodiments of this disclosure. The control signals shown in FIG. 8 are typical for switched capacitor circuits as more fully described in commonly owned U.S. Pat. No. 7,102,558, entitled "Five-Level Feed-Back Digital-to-Analog Converter for a Switched Capacitor Sigma-Delta Analog-to-Digital Converter" by Philippe Deval, and is incorporated by reference herein for all purposes. Control signals P1D and P2D (FIG. 9) are delayed copies of P1 and P2, respectively. P1D and P2D drive the input switches while P1 and P2 drive the switches at the virtual ground (see FIG. 9).

All control signals are non-overlapping in order to prevent a temporary simultaneous conduction through the switches between two subsequent phases of the switched capacitor sigma-delta ADC. Also the switches ((FIG. 9)) operating at the virtual ground must be turned off before the switches operating at the input (FIG. 9) in order to prevent signal dependent charge injection, as is well known to those skilled in switched capacitor sigma-delta ADC design.

During the control phase P1 both the input signal 118 and the DAC output 562 are sampled. During the control phase P2 both the input signal 118 and the DAC output 562 are transferred such that the integrated voltage (from the integrator 556) is valid toward the end of the control phase P2. Typically, the value of the integrated summed voltage from the integrator 556 is very close to its final value in the middle of the control phase P2. Thus control FF will cause the gated comparator 554 (FIG. 5) or the gated Flash ADC 654 (FIG. 6) to store the analog-to-digital conversion result. The comparison (FIG. 5) or FlashADC result (FIG. 6) is gated in the DAC after the control phase P2 returns to zero but before the control phase P1 goes high (logic 1). This sequence allows the DAC to maintain a constant value during a given control sequence of phases of P1 and P2 and to let the internal logic properly settle for the next control sequence of phases P1 and P2.

Referring to FIGS. 3 and 4, a basic chopper controller may be implemented with a D flip-flop connected in a frequency divide-by-two configuration (the inverting output non-Q is connected to the D input) that toggles each time the input signal and DAC output are sampled. It generates the standard +–+– . . . sequence necessary to cancel voltage reference offset component after every two integrations. According to the teachings of this disclosure, a dedicated chopper controller is used for each DAC level (FIG. 4). Each dedicated chopper controller is independent and is only activated when the corresponding DAC level is activated (or selected). For a first order modulator (having one integrator), e.g., the one shown in FIG. 5, each dedicated chopper controller may be implemented as a D flip-flop connected in the frequency divider-by-two configuration, as described hereinabove. Each chopper controller holds (or memorizes) its current output state when the DAC level to which it is associated is not selected. Therefore it restarts from the previous current state when the DAC level to which it is associated is selected again. This grants the correct +–+– chopping sequence for each of the DAC levels. The output of the latch 432 thereby generates the desired chopper clock 116.

According to the teachings of this disclosure, if a modulator having $m^{th}$ order integration is used, the standard chopper sequence +–+– has to be modified as described in U.S. Pat. No. 6,909,388 B1 entitled "Fractal Sequencing Schemes For Offset Cancellation in Sampled-Data Acquisition Systems" by Quiquempoix et al., which is incorporated by reference herein for all purposes. The fractal algorithm described is applied to the standard chopper sequence +– in order to obtain the sequence +––+ for a second order modulator, +––+–++– for a third order modulator and so on. This sequence is generated for every DAC level independent chopper control signal in order to cancel efficiently voltage reference offset components at the output of the chain of integrators in the sigma-delta modulator. As per the teachings of the above referenced patent, it should be noted that these higher order sequences require as many D flip-flops as the order of integration to be generated and a series of XOR gates to correctly generate the right fractal sequence.

Referring now to FIG. 3, depicted is a schematic circuit diagram of a clock control circuit for the chopper stabilized voltage reference of FIGS. 1 and 2 when used with a two-level digital-to-analog converter (DAC) of a sigma-delta modulator as shown in FIG. 5, according to a specific example embodiment of this disclosure. For the specific example embodiment of the sigma-delta modulator 106a of FIG. 5, the DAC output is differential. In this case, the differential voltage 562a-562b, Vdac, at the output of the feedback DAC 560 is equal to either +Vref or –Vref. When the serial bit stream 112a is at a logic 1 +Vref is output, and when the serial bit stream 112a is at a logic 0 –Vref is output. Therefore, the specific example embodiment of a first order bipolar sigma-delta modulator 106a, shown in FIG. 5, requires two memory cells that comprise D flip-flops 330 and 331 and associated logic gates and inverters as described in more detail hereinafter.

The chopper clock control 104a ensures that the chopper stabilized voltage reference 102 always is chopped (clock 116) such that there are an equal number of Vref=Vref+Voff and Vref=Vref−Voff during each sampling sequence of phases P1 and P2 correlated with the bit patterns from the serial bit stream 112a so that an equal number of +Voff and −Voff components cancel each other out.

There are two D flip-flops 330 and 331 used as divide-by-two frequency dividers, a latch 332 for synchronizing the chopper clock 116 with the sigma-delta modulator operation and a plurality of NAND and inverter gates 334 to 342 for the DAC level selection. The inverter 340 and the NAND gates 334 and 335 operate as a demultiplexer (or selector), while the inverter 340 and the NAND gates 336, 337 and 338 operate as a multiplexer.

The chopper clock 116 is synchronized with the sampling phase of the DAC output. Here the reference is sampled during phase P1 and transferred during phase P2. So the chopper clock 116 only changes synchronously with the phase P1. This synchronization is done by the latch 332 that latches the current chopper clock 116 during phase P1. As described hereinbelow, the data at the output of NAND gate 338 may only vary during the phase FF or on the rising edge of phase P2N. Therefore it is stable during phase P1 and a latch is sufficient here.

When the bitstream 112a is at a logic "0," the D flip-flop 330 is selected as the active chopper monitor through the NAND gates 334 and 336: The level at the output of inverter 340 is "1" as well as the level at the output of the NAND gates 335 and 337; the P2N phase accesses the negative edge trigged clock input of D flip-flop 330 through the NAND gate 334 and the D flip-flop 330 output state is transferred to the latch 332 input through NAND gates 336 and 338. So on each rising edge of the clock P2N the D flip-flop 330 toggles. As long as the bitstream 112a is at a logic 0, the D flip-flop 331 is in hold mode since its clock input is locked to "1."

As an example, call the D flip-flop 330 and its associated selecting logic "the chopper-monitor-channel 0" as well as the D flip-flop 331 and associated selecting logic "the chopper-monitor-channel 1." Note that the bitstream 112a may only change when FF is at logic 1, when both the P1 and P2N phases are "0." So when it occurs, this change modifies the selected active chopper monitor channel, but does not change the current state of the chopper monitor channels.

Let the bitstream 112a change from level 0 to level 1. As explained hereinabove, this change now selects the chopper-monitor-channel 1 to be the active one while the chopper-monitor-channel 0 is set to a hold (or memorizing) mode. So the chopper control signal sequence for bitstream/DAC level "1" continues normally from the state that was held the last time the bitstream/DAC level was at level "1."

Referring to FIG. 4, depicted is a schematic circuit diagram of a clock control circuit for the chopper stabilized bandgap voltage reference of FIGS. 1 and 2 when used with a five-level digital-to-analog converter (DAC) of the sigma-delta modulator having first order integration as shown in FIG. 6, according to another specific example embodiment of this disclosure. As described hereinabove, since there are five different voltage levels from the multi-level DAC 660 (FIG. 7), five memory cells will be required. These memory cells comprise negative edge triggered clock input D flip-flops 430a-430f. The chopper clock control 104b ensures that there are an equal number of pairs of samples taken for each level asserted such that there are an equal number of Vref=Vref+Voff (voltage offset) and Vref=Vref−Voff during each sampling sequence of phases P1 and P2 correlated with the bit patterns from the serial bit stream 112b at each level (Lev0-Lev4) so that an equal number of +Voff and −Voff of the reference voltage samples occur and thereby canceled each other out after integration.

Therefore, the chopper clock control 104b functions in the same fashion as the chopper clock control 104a, except that there are now five (5) chopper-control-channels rather than two (2). The 3-bit-to-5-line (or level) decoder 440 is more complex than the inverter 340, however, its overall functionality is the same: wherein one (1) chopper-control-channel is active while the other four (4) chopper-control-channels are in hold mode. Note that the 3-bit-to-5-line decoder may be shared with the five-level DAC 660 (FIG. 6).

According to the teachings of this disclosure, the number of chopper-control-channels are equal to the number of levels of the DAC. The decoding logic for multiplexing the chopper-control-channels increases with the number of distinct levels that the DAC can assume. Moreover the number of memory cells required in each chopper-control-channel is equal to the modulator order, e.g., number of integrations performed for an analog-to-digital conversion. The chopper-control-channel complexity therefore increases with the modulator order.

A more complex state machine that would apply the full +/−chopping sequence when possible (double Vref transfer or zero transfer, e.g., levels 0, 2 and 4 with the 5 level DAC) is contemplated and within the scope of this disclosure.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An over-sampling analog-to-digital converter (ADC) having improved voltage reference offset cancellation and reduced source induced 1/f noise, said ADC comprising:
   a sigma-delta modulator having plus and minus analog inputs, plus and minus reference voltage inputs and an output supplying serial digital information therefrom, wherein the sigma-delta modulator comprises:
      a plus input voltage capacitor having a capacitance of A*C/2,
      a minus input voltage capacitor having a capacitance of A*C/2,
      a first pair of switches adapted for switchably coupling the plus and minus input voltage capacitors to the plus and minus analog inputs, respectively,
      a second pair of switches adapted for switchably coupling the plus and minus input voltage capacitors to the minus and the plus inputs, respectively,
      a plus reference voltage capacitor having a capacitance of C/2, a minus reference voltage capacitor having a capacitance of C/2,
      a fifth pair of switches adapted for switchably coupling the plus and minus reference voltage capacitors to plus and minus reference voltage inputs, respectively,
      a sixth pair of switches adapted for switchably coupling the plus and minus reference voltage capacitors to the minus and the plus reference voltage inputs, respectively,
      a seventh switch adapted for switchably coupling the plus and minus reference voltage capacitors together,
      a third plurality of switches coupled to the plus and minus input voltage capacitors and the plus and minus reference voltage capacitors, and adapted for switchably coupling a common mode voltage, VCM, to these capacitors, and a fourth pair of switches adapted for coupling the plus and minus input voltage capacitors and the plus and minus reference voltage capacitors to a differential input of an amplifier, wherein the switches are sequenced in a charge phase and a transfer phase to produce five equally distributed voltage outputs from the amplifier of A*VIN+VREF, A*VIN+VREF/2, A*VIN+0, A*VIN−VREF/2 and A*VIN−VREF, where A is gain, VIN is an input voltage, and VREF is a reference voltage;

a chopper stabilized voltage reference supplying plus and minus reference voltages to the plus and minus reference voltage inputs of the sigma-delta modulator; and a chopper clock control coupled to the chopper stabilized voltage reference and the output of the sigma-delta modulator, wherein the chopper clock control uses the serial digital information from the output of the sigma-delta modulator to generate chopper clocks that cause the chopper stabilized voltage reference to supply reference voltages to the sigma-delta modulator that comprise an equal number of positive voltage offsets and negative voltage offsets for each level of digital-to-analog conversions, and whereby an average of the positive and negative voltage offsets cancel out voltage offset contribution to the reference voltages supplied to the sigma-delta modulator.

2. The ADC according to claim 1, wherein the chopper stabilized voltage reference comprises:

a bandgap voltage reference;

a chopper modulator coupled to the bandgap voltage reference;

a differential amplifier coupled to an output of the chopper modulator; and a chopper demodulator coupled to an output of the differential amplifier, wherein the chopper modulator and demodulator are controlled by the chopper clock control, and an output of the chopper demodulator supplies the reference voltage to the reference input of the sigma-delta modulator.

3. The ADC according to claim 2, wherein the chopper stabilized voltage reference further comprises an output buffer amplifier.

4. The ADC according to claim 3, wherein the output buffer amplifier has differential inputs and differential outputs.

5. The ADC according to claim 1, wherein the sigma-delta modulator is a multi-level sigma-delta modulator, and the serial digital information comprises a plurality of serial bit streams from outputs of the sigma-delta modulator, wherein an equal number of reference voltages having positive voltage offsets and negative voltage offsets for each level of the digital-to-analog conversions are supplied to the multi-level sigma-delta modulator.

6. The ADC according to claim 1, further comprising a digital filter coupled to the output of the sigma-delta modulator and adapted to convert the serial digital information into digital words representative of samples of analog voltages on the analog input of the sigma-delta modulator.

7. The ADC according to claim 6, wherein the digital filter is a digital low pass filter.

8. The ADC according to claim 6, wherein the digital filter is a digital decimation filter.

9. The ADC according to claim 1, wherein the sigma-delta modulator is a two-level sigma-delta modulator, and the serial digital information comprises a single serial bit stream.

10. The ADC according to claim 9, wherein the two-level sigma-delta modulator comprises:

an analog voltage summation circuit coupled to the analog input;

a two-level digital-to-analog converter (DAC) having an output coupled to the analog voltage summation circuit, a reference voltage input coupled to the chopper stabilized voltage reference, and a control input;

an analog voltage integrator coupled to an output of the analog voltage summation circuit; and a voltage comparator having an analog input, a gate input and a gated output, the analog input is coupled to an output of the analog voltage integrator, wherein the gated output of the voltage comparator is at a first logic level when a first voltage is on the analog input, and is at a second logic level when a second voltage is on the analog input;

sample clocks are coupled to the gate input of the gated voltage comparator, whereby the output logic state at the gated output of the voltage comparator is held between the sample clocks;

the gated output of the voltage comparator is coupled to the control input of the two-level DAC, wherein the gated output supplies the serial digital information from the sigma-delta modulator; and the two-level DAC supplies a first voltage to the reference input of the analog voltage summation circuit when the control input of the two-level DAC is at the first logic level, and a second voltage to the reference input of the analog voltage summation circuit when the control input of the two-level DAC is at the second logic level, whereby the first and second voltages from the two-level DAC are combined with respective ones of the voltages sampled at the analog input by the analog voltage summation circuit.

11. The ADC according to claim 10, wherein the first voltage is the plus reference voltage and the second voltage is the minus reference voltage.

12. The ADC according to claim 11, wherein the first voltage is the minus reference voltage and the second voltage is the plus reference voltage.

13. The ADC according to claim 9, wherein the chopper clock control comprises:

two D Flip-Flops, each of the two D Flip-Flops being associated with a respective one of the two-level sigma-delta modulator, wherein each of the two D Flip-Flops stores chopper and respective level values based upon logic levels of the bitstream; and a synchronizing latch, wherein the synchronizing latch synchronizes operation of the chopper clocks from the chopper clock control, whereby the chopper clocks are output from the synchronizing latch such that the reference voltages supplied to the two-level sigma-delta modulator comprise an equal number of positive voltage offsets and negative voltage offsets for each level of the two levels of the digital-to-analog conversions, and whereby the average of the positive and negative voltage offsets cancel out voltage offset contribution to the reference voltages supplied to the two-level sigma-delta modulator.

* * * * *